United States Patent
Kim et al.

(10) Patent No.: US 8,929,124 B2
(45) Date of Patent: Jan. 6, 2015

(54) RESISTIVE MEMORY DEVICE AND RELATED METHOD OF OPERATION

(71) Applicant: Samsung Semiconductor Co., Ltd., Suwon-Si, Gyeonggi-Do (KR)

(72) Inventors: Dae Han Kim, Seoul (KR); Cheon An Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 9 days.

(21) Appl. No.: 13/765,990

(22) Filed: Feb. 13, 2013

(65) Prior Publication Data

US 2013/0235648 A1 Sep. 12, 2013

(30) Foreign Application Priority Data

Mar. 12, 2012 (KR) .................. 10-2012-0025160

(51) Int. Cl.
G11C 11/00 (2006.01)
G11C 13/00 (2006.01)
G11C 11/56 (2006.01)
H01L 27/24 (2006.01)

(52) U.S. Cl.
CPC .......... *G11C 13/0069* (2013.01); *G11C 13/004* (2013.01); *G11C 11/56* (2013.01); *G11C 13/0064* (2013.01); *H01L 27/249* (2013.01)
USPC ............................................ 365/148; 365/158

(58) Field of Classification Search
CPC ............................ G11C 13/0069; G11C 11/16
USPC .................................................. 365/148, 158
See application file for complete search history.

(56) References Cited

U.S. PATENT DOCUMENTS

| 7,903,447 | B2 | 3/2011 | Lung |
| 7,978,497 | B2 | 7/2011 | Maejima |
| 7,978,507 | B2 | 7/2011 | Scheuerlein |
| 2008/0062743 | A1* | 3/2008 | Mayer et al. .................. 365/149 |
| 2009/0040814 | A1 | 2/2009 | Kang et al. |
| 2010/0165714 | A1 | 7/2010 | Wu et al. |
| 2010/0226164 | A1 | 9/2010 | Nagashima et al. |
| 2011/0038195 | A1* | 2/2011 | Hamilton et al. ............. 365/148 |
| 2011/0066900 | A1 | 3/2011 | Tokiwa |
| 2011/0134682 | A1 | 6/2011 | Xi et al. |

* cited by examiner

*Primary Examiner* — Michael Tran
(74) *Attorney, Agent, or Firm* — Volentine & Whitt, PLLC

(57) ABSTRACT

A resistive memory device includes a resistive memory cell, and a read/program circuit configured to program the resistive memory cell from a first state to a second state. The read/program circuit reads a resistance in the first state of the resistive memory cell and adjusts a compliance current supplied to the resistive memory cell according to the read resistance during the program operation.

16 Claims, 16 Drawing Sheets

RESISTIVE MEMORY DEVICE AND RELATED METHOD OF OPERATION

CROSS-REFERENCE TO RELATED APPLICATIONS

This application claims priority under 35 USC §119 to Korean Patent Application No. 10-2012-0025160 filed on Mar. 12, 2012, the subject matter of which is hereby incorporated by reference.

BACKGROUND OF THE INVENTION

The inventive concept relates generally to semiconductor memory devices. More particularly, certain embodiments of the inventive concept relate to resistive memory devices and related methods of operation.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power. Examples of volatile memory devices include dynamic random access memory (DRAM) and static random access memory (SRAM), and examples of nonvolatile memory devices include flash memory, resistive random access memory (RRAM), and ferroelectric random access memory (FRAM), to name but a few.

In recent years, there has been an increasing demand for nonvolatile memory devices having improved performance and storage capacity. Accordingly, in an effort to meet this demand, researchers are engaged in ongoing efforts to further develop and improve the above and other types of nonvolatile memory devices.

SUMMARY OF THE INVENTION

In one embodiment of the inventive concept, a resistive memory device comprises a resistive memory cell and a read/program circuit configured to program the resistive memory cell from a first state to a second state. The read/program circuit reads a resistance in the first state of the resistive memory cell and adjusts a compliance current supplied to the resistive memory cell according to the read resistance during the program operation.

In another embodiment of the inventive concept, a method of programming a resistive memory device comprises determining a resistance of a resistive memory cell in a first state, determining a compliance current of the resistive memory cell based on the determined resistance, and maintaining the resistance memory cell in the first state or programming the resistive memory cell to a second state according to the determined compliance current.

In still another embodiment of the inventive concept, a method of programming a resistive memory device comprises determining a resistance of a plurality of resistive memory cells in a first state, determining a compliance current for programming the resistive memory cells based on the determined resistance, and selectively programming the resistive memory cells based on the determined compliance current.

These and other embodiments of the inventive concept can potentially reduce disturb stress applied to a memory cell through the use of a program voltage, reduce a resistance distribution of memory cells, and improve the reliability of a resistive memory device.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the accompanying drawings. These embodiments are presented as teaching examples and should not be construed to limit the scope of the inventive concept.

Figure 1:
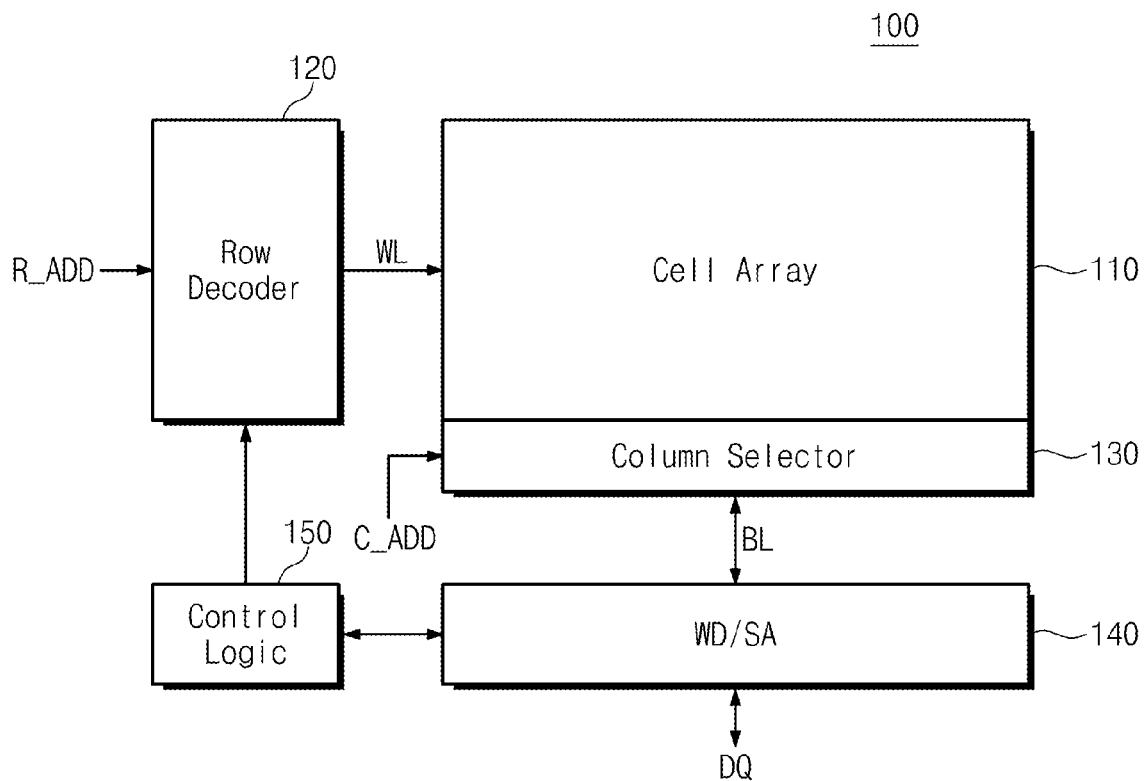
FIG. 1 is a block diagram of a resistive memory device according to an embodiment of the inventive concept.

FIG. 1 is a block diagram of a resistive memory device 100 according to an embodiment of the inventive concept.

Referring to FIG. 1, resistive memory device 100 comprises a cell array 110, a row decoder 120, a column selector 130, a read/program circuit 140, and control logic 150.

Cell array 110 comprises a plurality of resistive memory cells. The resistive memory cells store specific data according to their resistances. A detailed configuration and circuit diagram of resistive memory cells in cell array 110 will be described with reference to FIGS. 2 to 3D.

A program voltage or a verify voltage is supplied to a memory cell through a wordline WL or a bitline BL. Although it is described that the program voltage or current for a program operation is supplied through a wordline WL, the inventive concept is not limited to the described conditions. For instance, the program voltage or the current for a program operation may be supplied through a bitline BL.

Cell array 110 can be formed on a two-dimensional plane, or alternatively, it can be formed with a three-dimensional structure. Cell array 110 comprises wordline planes WL stacked in a vertical direction and channels or bitlines BL formed in a vertical direction. An electrode and a data storage layer may be disposed between wordlines planes of each layer and a channel connected to a bitline.

Row decoder 120 decodes a row address R_ADD to select one of the wordlines of cell array 110. During a read operation, row decoder 120 supplies a read voltage Vread to selected wordline WL and supplies a blocking voltage for blocking leakage current to unselected wordline WL.

During a program operation, row decoder 120 supplies a program voltage to selected wordline WL and supplies an inhibit voltage for a program inhibition operation to unselected wordlines WL.

Column selector 130 selects at least one of a plurality of bitlines with reference to a column address C_ADD. Bitline BL selected by column selector 130 is connected to read/program circuit 140.

Read/program circuit 140 programs input data into cell array 110 or senses and outputs data written into cell array 110 to an external entity. These operations are performed under control of control logic 150.

During a read operation, read/program circuit 140 detects sensing current flowing to a selected memory cell according to the read voltage supplied by row decoder 120 to identify data stored in the memory cell.

The following Table 1 shows voltages applied to selected/unselected wordlines and selected/unselected bitlines of memory cell array 110 during a read operation.

TABLE 1

|  | Applied Voltage |
| --- | --- |
| Selected WL | Vread |
| Unselected WL | Vblk1 |
| Selected BL | NA |
| Unselected BL | Vblk2 |

In Table 1, Vread represents a read voltage supplied to a selected wordline, and Vblk1 and Vblk2 represents blocking voltages supplied to an unselected wordline and an unselected bitline, respectively. Blocking voltage Vblk1 is smaller than read voltage Vread and may be set to half read voltage Vread (i.e., Vblk1=Vread/2). In some embodiments, blocking voltages Vblk1 and Vblk2 are set to the same level.

The selected bitline detects the sensing current flowing to the selected memory cell. The sensing current detected from the selected bitline is supplied to a sense amplifier.

Under the above voltage conditions, a difference between voltages at both terminals of a selected memory cell is Vread. Accordingly, sensing current of predetermined intensity may flow through a selected memory cell depending on the resistance state (a high or low resistance state, a reset state or a set state) of the selected memory cell.

On the other hand, a difference between voltages at both terminals of an unselected memory cell may be Vblk1−Vblk2. If the Vblk1 and Vblk2 have the same magnitude, a difference between the Vblk1 and Vblk2 (Vblk1−Vblk2) may be zero. Accordingly, current may not flow through the unselected memory cell and leakage current may be reduced.

During a program operation, read/program circuit 140 supplies a ground voltage or an inhibit voltage to a selected bitline BL. In some embodiments, voltages respectively supplied to selected/unselected wordlines and selected/unselected bitlines during a program operation are shown in Table 2, as bellows:

TABLE 2

|  | Applied Voltage |
| --- | --- |
| Selected WL | Vset |
| Unselected WL | Vinh1 |
| Selected BL | 0 V |
| Unselected BL | Vinh2 |

In Table 2, Vset represents a program voltage supplied to a selected wordline, and Vinh1 and Vinh2 represent inhibit voltages supplied to an unselected wordline and an unselected bitline, respectively. Inhibit voltage Vinh1 is smaller than program voltage Vset and may be set to half program voltage Vset (i.e., Vinh1=Vset/2). In some embodiments, inhibit voltage Vinh1 may be set to the same level or a lower level as or than inhibit voltage Vinh2.

Under the above voltage conditions, a difference between voltages at both terminals of a selected memory cell is Vset. If the Vset is greater than a critical value for a program operation, the selected memory cell may be programmed. On the other hand, a difference between voltages at both terminals of an unselected memory cell is Vinh1−Vinh2. Because the magnitude of Vinh1−Vinh2 is small (or 0 volt) enough not to program a memory cell, an unselected memory cell is not programmed.

Read/program circuit 140 supplies compliance current Ic where a memory cell is programmed from a reset state corresponding to a high voltage state to a set state that is a low voltage state. Read/program circuit 140 supplies compliance current Ic even where the memory cell is programmed from a set state corresponding to a low voltage state a reset state that is a high voltage state.

Compliance current Ic is applied to limit current flowing to a selected bitline BL. The compliance current is described in further detail with reference to FIG. 4.

In some embodiments, read/program circuit 140 selectively supplies a plurality of compliance currents Ic to a selected memory cell through a selected bitline BL. In addition, a ground voltage may be supplied to selected bitline BL. The read/program circuit may provide a verification result obtained by a verify voltage to control logic 150 to detect a result of a program operation.

During the program operation, read/program circuit 140 supplies different compliance currents Ic to respective memory cells with reference to a resistance state of a memory cell. For example, suppose that memory cells in a high resistance state (e.g., a reset state) are set to a low resistance state (e.g., set state). Under these circumstances, read/program circuit 140 supplies lower compliance current Ic to a memory cell having a lower resistance among the plurality of memory cells. Meanwhile, read/program circuit 140 supplies higher compliance current Ic to a memory cell having a high resistance among the plurality of memory cells. The lower compliance current Ic allows a resistance of a memory cell to be less changed, while the higher compliance current Ic allows the resistance of the memory cell to be more changed. Thus, the supplied compliance current Ic may be adjusted according to the resistance of the memory cell to control a resistance distribution of programmed (set or reset) memory cells. At this point, the resistance of the memory cell in a high resistance state may be read from determination current Id detected by applying a determination voltage Vd. Determination voltage Vd, determination current Id, and compliance current Ic will be described in detail later.

Through the above method, resistive memory device 100 may reduce the resistance distribution of memory cells. In addition, because the resistance distribution of memory cells is reduced by performing a program operation once, program voltage pulses (e.g., ISPP voltage pulse) are not required. As a result, disturb stress caused by the plurality of program voltage pulses may be alleviated.

Control logic 150 controls read/program circuit 140 and row decoder 120 in response to a program or read command. Control logic 150 controls read/program circuit 140 and row decoder 120 to synchronize a wordline voltage and a bitline voltage of a selected memory cell with each other.

In some embodiments, during a program operation, control logic 150 determines whether a program loop is executed relative to a selected memory cell with reference to the verification result provided from read/program circuit 140. Once it is determined that all selected memory cells are programmed to a desired resistance, control logic 150 stops a program loop and terminate the program operation.

As indicated by the foregoing, resistive memory device 100 may adjust the intensity of supplied compliance current Ic depending on a resistance of a memory cell selected during a program operation. Thus, the selected memory cell may be precisely programmed to a desired set or reset state. In addition, the resistance distribution of memory cells is reduced due to the small number of program operations. Thus, the disturb stress caused by a repeatedly applied program voltage may be reduced to enhance reliability of resistive memory device 100.

Figure 2:
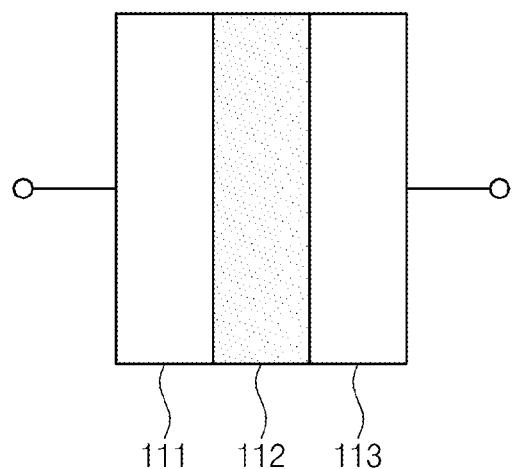
FIG. 2 illustrates the configuration of a memory cell in a cell array in FIG. 1.

FIG. 2 illustrates the configuration of a memory cell in cell array 110 in FIG. 1 according to an embodiment of the inventive concept.

Referring to FIG. 2, the memory cell comprises a pair of electrodes 111 and 113 and a data storage layer 112 disposed therebetween.

Electrodes 111 and 113 constituting a resistive element may be made of various metals, metal oxides or metal nitrides. For instance, electrodes 111 and 113 may be made of aluminum (Al), copper (Cu), titanium nitride (TiN), titanium aluminum nitride ($Ti_xAl_yN_z$), iridium (Ir), platinum (Pt), silver (Ag), gold (Au), polysilicon, tungsten (W), titanium (Ti), tantalum (Ta), tantalum nitride (TaN), tungsten nitride (WN), nickel (Ni), cobalt (Co), chrome (Cr), antimony (Sb), iron (Fe), molybdenum (Mo), palladium (Pd), tin (Sn), zirconium (Zr), zinc (Zn), iridium oxide ($IrO_2$) or strontium zirconium oxide ($SrZrO_3$).

Data storage layer 112 may be formed of a bipolar resistance memory material or a unipolar resistance memory material. The bipolar resistance memory material may be programmed to a set state or a reset state even by a pulse of the same polarity. The unipolar resistance memory material comprises a unitary transition metal oxide such as NiOx or TiOx. The bipolar resistance memory material comprises Perovskite-based materials.

Figure 3A:
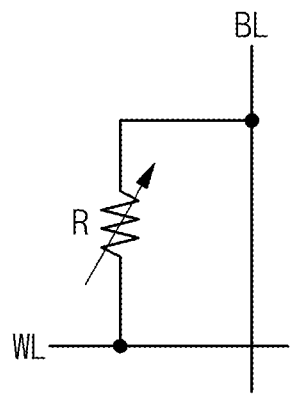
FIGS. 3A to 3D are circuit diagrams illustrating the memory cell in FIG. 2 according to various embodiments of the inventive concept.
Figure 3B:
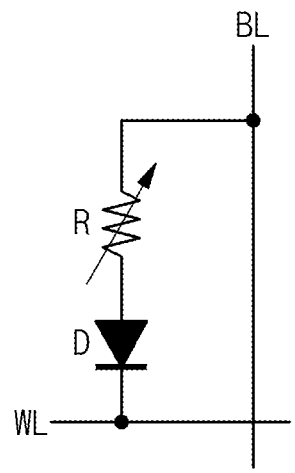
Figure 3C:
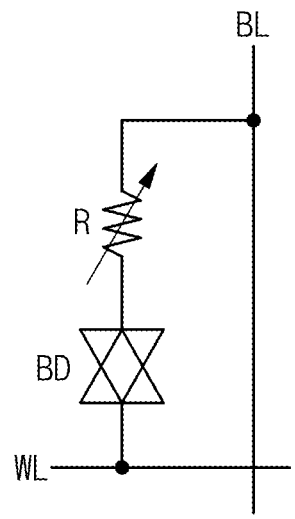
Figure 3D:
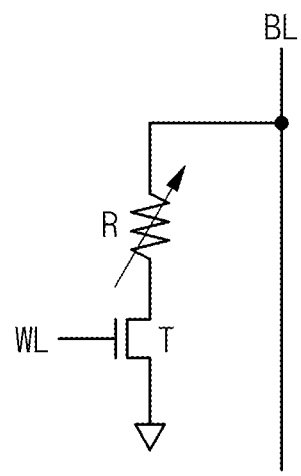

FIGS. 3A to 3D are circuit diagrams of a memory cell in FIG. 2 according to various embodiments of the inventive concept. FIG. 3A shows a memory cell without a selection element, while FIGS. 3B to 3D show memory cells each comprising a selection element.

Referring to FIG. 3A, a memory cell comprises a resistive element R connected to a bitline BL and a wordline WL. Such a resistive memory cell having a structure without a selection element stores data by a voltage applied between bitline BL and wordline WL.

Referring to FIG. 3B, a resistive memory cell comprises a resistive element R and a diode D. Resistive element R comprises a resistive material for data storage. Diode D is a selection element (or switching element) configured to supply current to resistive element R or cut off the current supply to resistive element R according to a bias of wordline WL and bitline BL. Diode D is coupled between resistive element R and wordline WL, and resistive element R is coupled between bitline BL and diode D. Positions of diode D and resistive element R are interchangeable. Diode D is turned on or turned off by a wordline voltage. Thus, a resistive memory cell is not driven where a voltage of a constant level or higher is supplied to an unselected wordline WL.

Referring to FIG. 3C, a resistive memory cell comprises a resistive element R and a bidirectional diode BD. Resistive element R comprises a resistive material for data storage. Bidirectional diode BD is coupled between resistive element R and a wordline WL, and resistive element R is coupled between a bitline BL and bidirectional diode BD. Positions of bidirectional diode BD and resistive element R are interchangeable. Bidirectional diode BD may block leakage current flowing to an unselected resistive memory cell.

Referring to FIG. 3D, a resistive memory cell comprises a resistive element R and a transistor T. Transistor T is a selection element (or switching element) configured to supply current to resistive element R or cut off the current supply to resistive element R according to a voltage of a wordline WL. Transistor T is coupled between resistive element R and a wordline, and resistive element R is coupled between a bitline BL and transistor T. Positions of transistor T and resistive element R are interchangeable. The resistive memory cell may be selected or unselected depending on whether transistor T drive by wordline WL is turned on or turned off.

While examples of a resistive memory cells have been described, the resistive memory cell is not limited to the foregoing examples.

Figure 4:
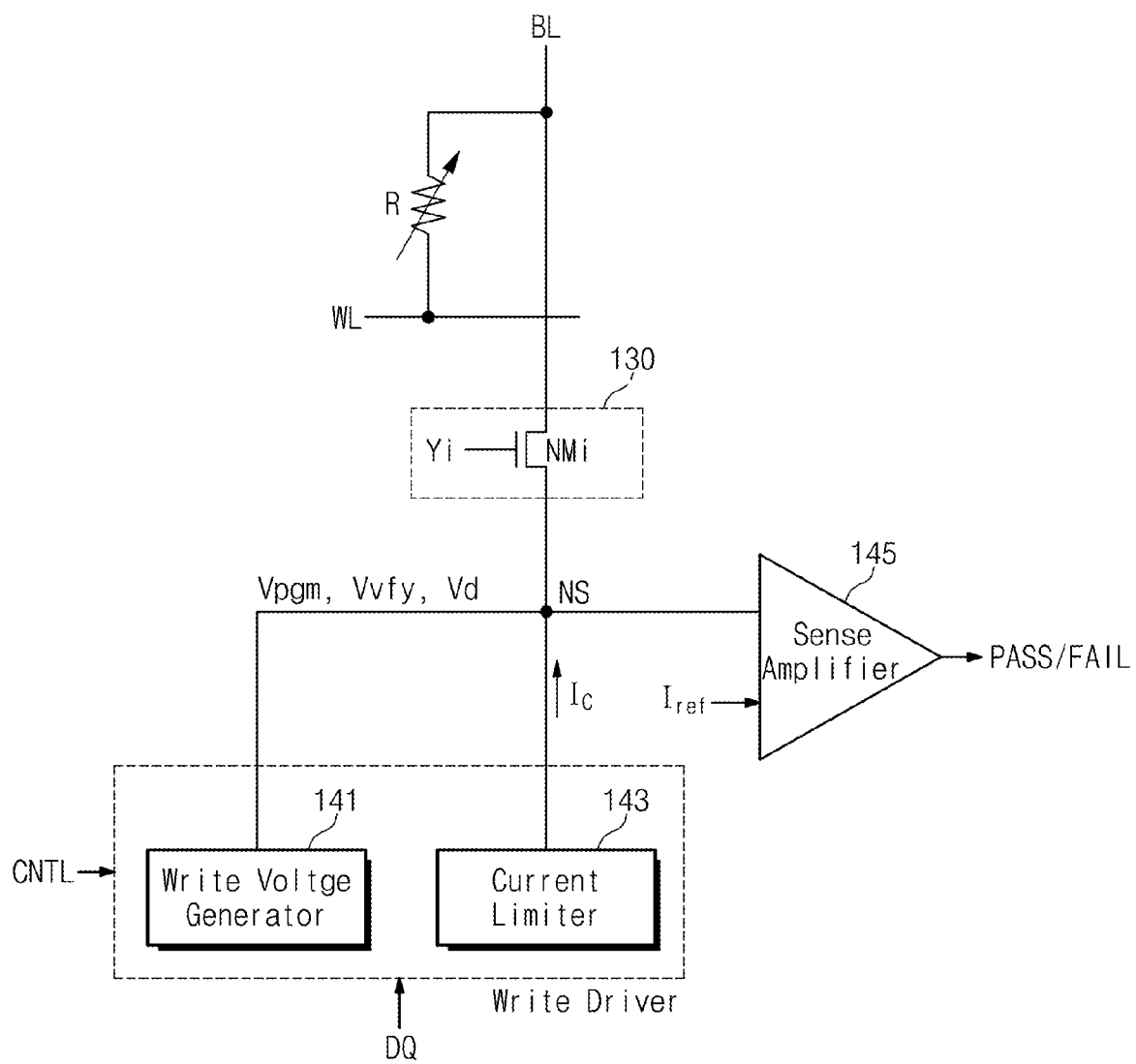
FIG. 4 is a block diagram illustrating a read/program circuit in FIG. 1 according to an embodiment of the inventive concept.

FIG. 4 is a block diagram of read/program circuit 140 according to an embodiment of the inventive concept.

Referring to FIG. 4, read/program circuit 140 comprises a program voltage generator 141 and a current limiter 143, and a sense amplifier 145.

Program voltage generator 141 supplies a voltage applied to a bitline BL during a program, read or verify operation. In some embodiments, program voltage generator 141 supplies a ground voltage to a selected bitline during a program operation. Program voltage generator 141 supplies an inhibit voltage Vinh2 to an unselected bitline (not shown). Program voltage generator 141 supplies a blocking voltage Vblk2 to the unselected bitline during a read or verify operation.

A voltage supplied by program voltage generator 141 is transferred to a node NS to be switched with a bitline. The voltage transferred to node NS is transferred to a bitline BL by a transistor NMi constituting a column selector 130.

Sense amplifier 145 senses an electrical signal set to node NS at the point of time where a verify voltage is supplied. For example, sense amplifier 145 may sense current flowing to a memory cell to detect a resistance of the memory cell at a point of time where a verify voltage is supplied. Where it is determined that the detected resistance of the memory cell is programmed to be greater or smaller than a desired resistance, sense amplifier 145 transmits a pass signal PASS to control logic 150. On the other hand, where it is determined that the detected resistance of the memory cell does not reach a desired resistance range, sense amplifier 145 transmits a fail signal FAIL to control logic 150.

In some embodiments, sense amplifier 145 compares current flowing to node NS with reference current Iref to check program pass or fail of a memory cell. Under these circumstances, reference current Iref may be supplied from current limiter 143.

During a program, read or verify operation, row decoder 120 applies a predetermined voltage (program, read or verify voltage) to a selected wordline. The verify voltage is a voltage for verifying whether a resistance of a memory cell is programmed to be greater or smaller than a reference value.

Conditions of applying a voltage to a selected/unselected wordline are identical to those explained with reference to Table 1 and Table 2. In addition, voltage application conditions of a verify operation are identical to those of a read operation. However, in some embodiments, the magnitude of a verify voltage Vverify applied to a selected wordline during a verify operation may be different from that of a read voltage Vread applied during a read operation.

In some embodiments, row decoder 120 provides a determination voltage Vd for reading a resistance of a resistive memory cell before the resistive memory cell is programmed. Determination voltage Vd may be transferred to a memory cell or a wordline WL along the same path as a program voltage. Sense amplifier 145 senses current flowing to a memory cell where determination voltage Vd is applied to the memory cell (hereinafter, the current will be referred to as "determination current Id"). Sense amplifier 145 reads the resistance of the memory cell from determination current Id. The read resistance of the memory cell is referred to so as to determine compliance current Ic of the memory cell. The higher the read resistance of the memory cell, the more compliance current Ic of the memory cell increases.

Current limiter 143 supplies compliance current applied during a program operation of a memory cell. In some embodiments, current limiter 143 supplies the determined compliance current Ic with reference to the resistance read from determination current Id. In addition, current limiter 143 supplies different compliance currents Ic to respective memory cells according to the resistance read from determination current Id.

Compliance current Ic is current for limiting current flowing to a memory cell. Specifically, compliance current Ic is connected to a bitline of a memory cell to limit the maximum of current flowing to the memory cell to the intensity of compliance current Ic. Accordingly, the intensity of current flowing out through a bitline does not increase over compliance current Ic even where a voltage applied to both terminals of the memory cell increases. As a result, charges are accumulated at a low potential terminal of the memory cell and a difference between voltages at both the terminals of the memory cell decreases.

That is, compliance current Ic may limit the current flowing to the memory cell to limit a difference between voltages applied to both the terminals of the memory cell. Compliance current Ic may be used to precisely control a programmed state of the memory cell.

Read/program circuit 140 reads a resistance of a memory cell before the memory cell is programmed. In addition, read/program circuit 140 supplies compliance current Ic determined with reference to the read resistance to the memory cell. Read/program circuit 140 supplies different compliance currents Ic to respective memory cells according to the read resistance. Thus, change in resistance of each memory cell may be precisely controlled by controlling compliance current Ic. As a result, resistance distribution of programmed memory cells may be reduced.

Figure 5:
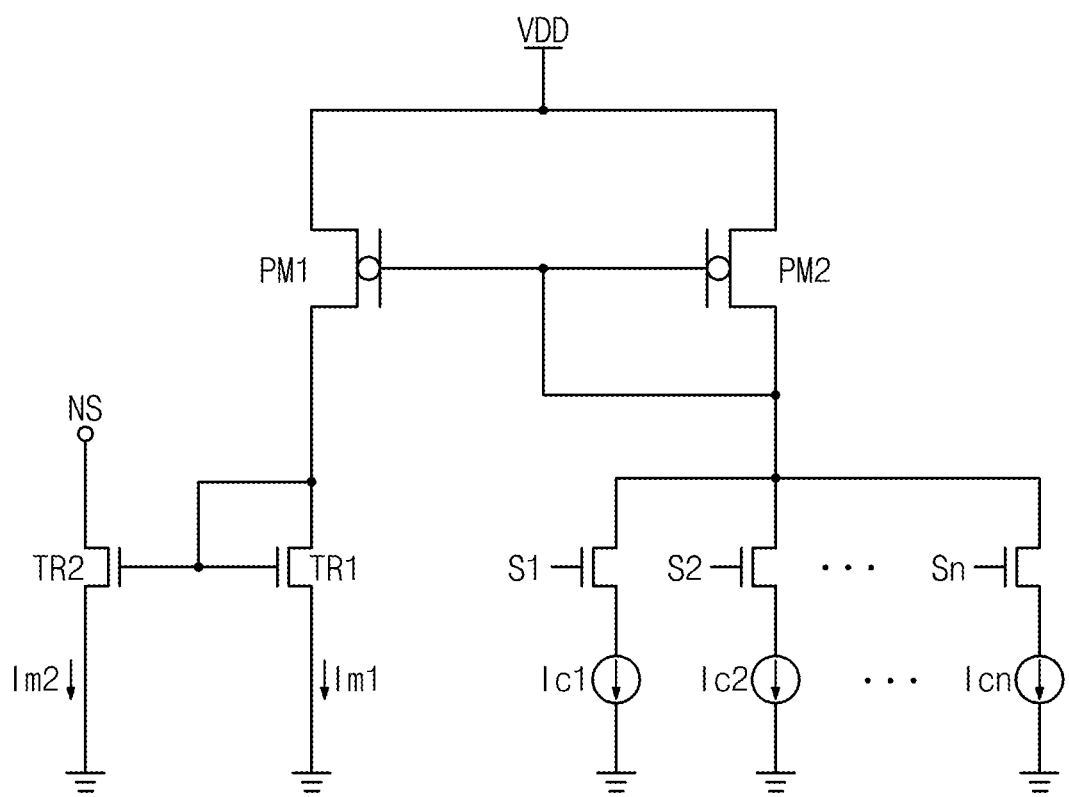
FIG. 5 is a circuit diagram illustrating a current limiter in FIG. 4 according to an embodiment of the inventive concept.

FIG. 5 is a circuit diagram of current limiter 143 according to an embodiment of the inventive concept. In the embodiment of FIG. 5, current limiter 143 has the form of a current mirror.

Current limiter 143 comprises a PMOS transistor PM1 connected to a node NS connected to a bitline BL and a PMOS transistor PM2 connected to a plurality of current sources Ic1-Icn. Current sources Ic1-Icn may provide different current values, respectively. The current sources are switched by selection signals S1-Sn according to a resistance read from compliance current Ic. At least one of current sources Ic1-Icn is selected by selection signals S1-Sn.

By the selected current source, reference current Im1 is supplied to a current mirror comprising two transistors TR1 and TR2. Bias current supplied to a gate of transistor TR2 allows minor current having the same intensity as reference current Im1 to flow through node NS. At this point, minor current Im2 functions as compliance current Ic to limit the intensity of current flowing to the memory cell.

Figure 6:
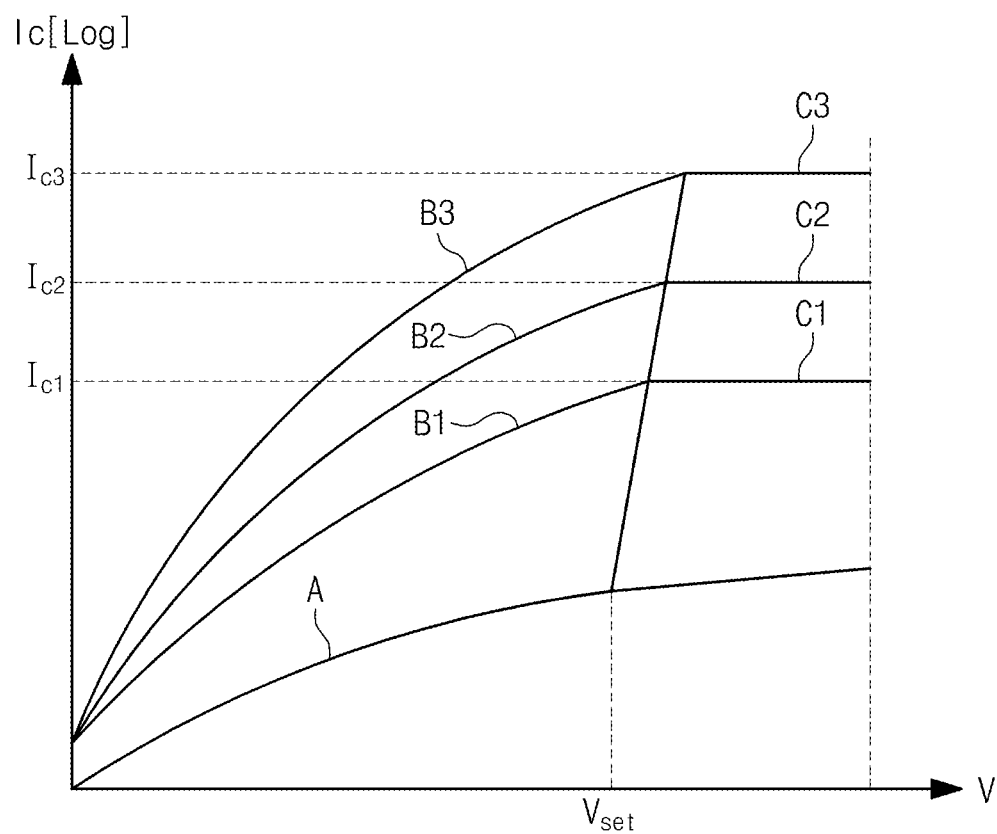
FIG. 6 illustrates hysteresis characteristics of a resistive memory cell according to an embodiment of the inventive concept.

FIG. 6 illustrates hysteresis characteristics of a resistive memory cell according to an embodiment of the inventive concept. The resistive memory cell exhibits hysteresis characteristics varying depending on the intensity of compliance current.

Where a program voltage (or set voltage Vset) is applied to both terminals of a memory cell which remains in a reset state, current-voltage characteristics change to a curve which is different from that in the reset state. In other words, the resistive memory cell exhibits hysteresis characteristics. Accordingly, in certain embodiments, program performance to a set state of a resistive memory cell can be enhanced by addressing the hysteresis characteristics.

A reset-state memory cell has current-voltage characteristics indicated by a curve A. Where a program voltage Vset is applied to the reset-state memory cell together with first compliance current Ic1, a current-voltage curve of the memory cell changes to a curve B1. Under these circumstances, a current value of the memory cell does not increase any longer after reaching the first compliance current Ic1 while only a voltage increases. That is, a maximum of current flowing to the memory cell is limited by the first compliance current Ic1.

On the other hand, where program voltage Vset is applied to the reset-state memory cell together with second compliance current Ic2, the current-voltage curve of the memory cell changes to a curve B2. Under these circumstances, a current value of the memory cell does not increase any longer after reaching the second compliance current Ic2 while only a voltage increases. That is, the maximum of current flowing to the memory cell is limited by second compliance current Ic2.

Similarly, where program voltage Vset is applied to the reset-state memory cell together with third compliance current Ic3, the current-voltage curve of the memory cell changes to a curve B3.

That is, the current-voltage curve in a set state of the memory cell varies depending on the intensity of applied compliance current Ic. This means that a resistance of the memory cell may vary depending on compliance current Ic.

On the other hand, a program voltage (or set voltage Vset) applied to the memory cell during a program operation must be a high voltage which is capable of changing a resistance state of the memory cell.

Programming to a set state using compliance currents Ic1, Ic2, and Ic3 has been illustrated above. A resistive memory cell may have a resistance of various recognizable levels with respect to compliance currents Ic1, Ic2, and Ic3.

Figure 7:
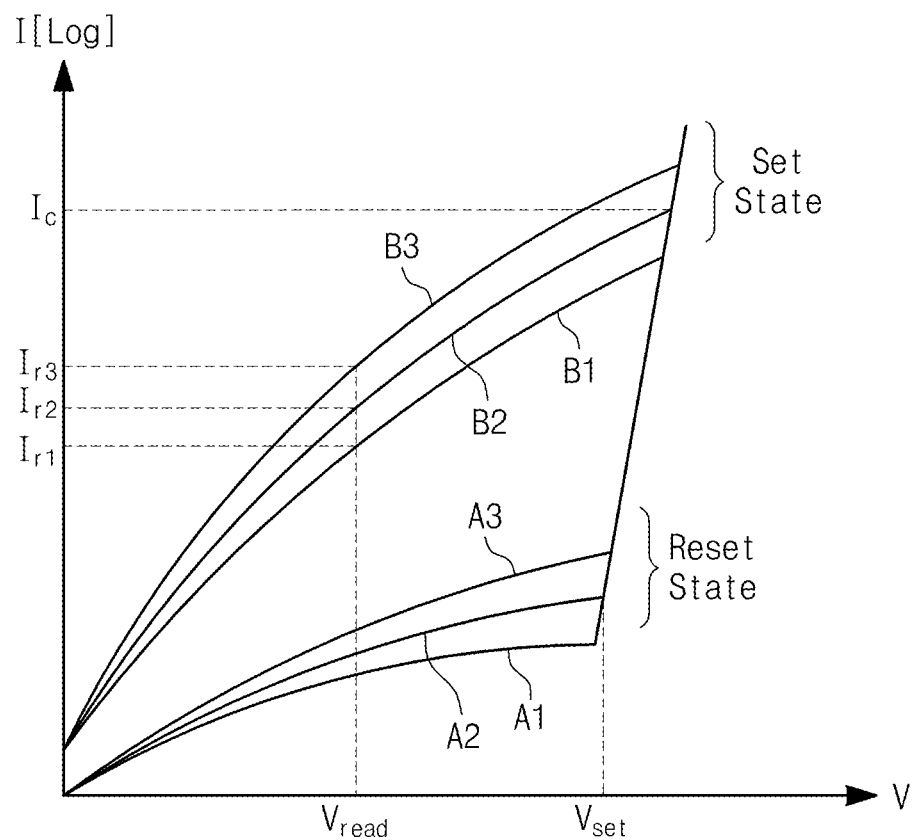
FIG. 7 illustrates a resistance distribution of resistive memory cells programmed by the same compliance current.

FIG. 7 illustrates the resistance distribution of resistive memory cells programmed by the same compliance current. In FIG. 7, reset-state curves and set-state curves for three resistive memory cells are shown.

The three memory cells may have different characteristics due to variations in manufacturing processes or environment. Thus, the three memory cells may have different current-voltage curves A1, A2, and A3 even in the same resistance state (e.g., reset state), respectively.

Where the memory cells are programmed using the same compliance current Ic, the resistance distribution of the programmed memory cells may be wide. That is, the programmed memory cells have different current-voltage curves B1, B2, and B3 due to the characteristic difference of the memory cells, respectively. Under these circumstances, where a read voltage Vread is applied to each of the memory cells, different read currents Ir1, Ir2, and Ir3 are detected. This means that the programmed memory cells have different resistances, respectively. The more the characteristic difference of the memory cells, the greater the resistance distribution of the programmed memory cells. In addition, if the resistance distribution of the memory cells increases excessively, reliability of a resistive memory device is degraded.

Figure 8:
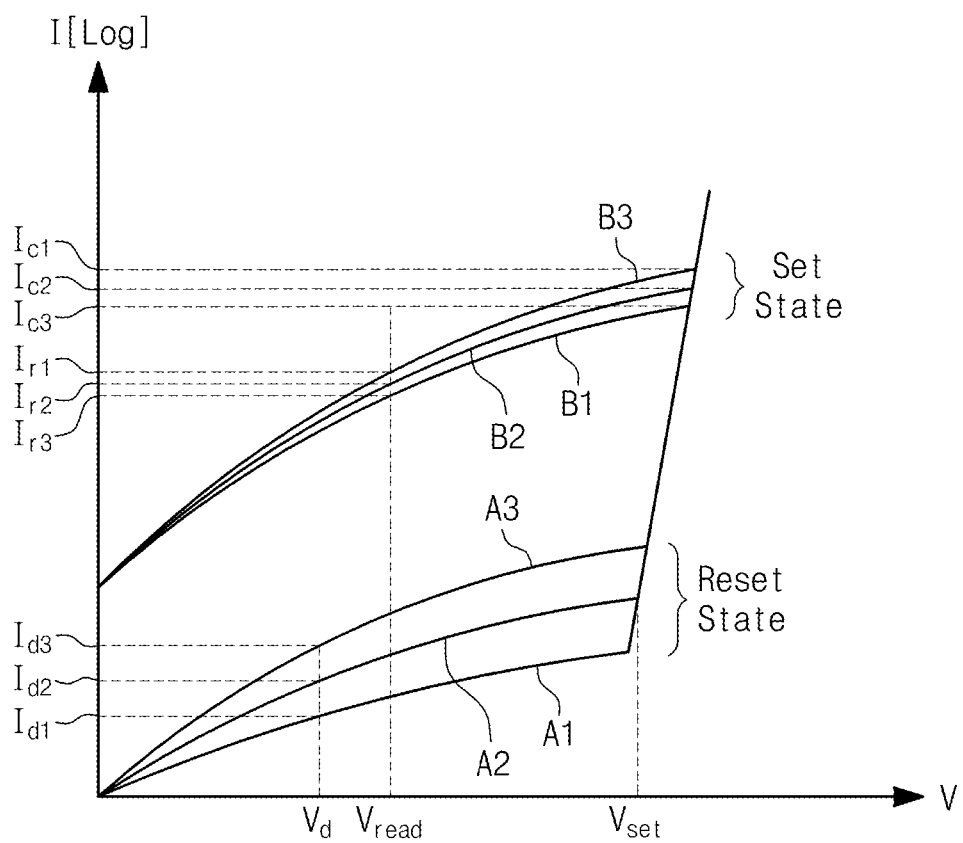
FIG. 8 illustrates resistance distribution of programmed resistive memory cells according to an embodiment of the inventive concept.

FIG. 8 illustrates the resistance distribution of programmed resistive memory cells according to an embodiment of the inventive concept. In this embodiment, a resistance of a resistive memory cell is read before the resistive memory cell is programmed. Compliance currents applied to the respective memory cells are adjusted depending on the read resistance of the memory cell. In FIG. 8, reset-state curves and set-state curves for the three resistive memory cells are shown.

The three memory cells may have different characteristics due to variations in manufacturing processes and environment. Thus, the three memory cells may have different current-voltage curves A1, A2, and A3 even in the same resistance state (e.g., reset state), respectively. In this embodiment, reset-state memory cells are programmed to a set state.

Before memory cells are programmed, resistive memory device 100 applies a determination voltage Vd to each resistive memory cell. Determination currents Id1, Id2, and Id3 flowing to each memory cell are detected at the point of time where determination voltage Vd is applied. The application of determination voltage Vd and the detection of determination currents Id1, Id2, and Id3 are done in the same manner as described above.

The detected determination currents Id1, Id2, and Id3 indicate resistances of the memory cells. That is, the resistances of the memory cells may be read from determination currents Id1, Id2, and Id3. Under these circumstances, the less determination current, the higher resistance.

Compliance current to be supplied to each memory cell is determined with reference to the detected resistance (or determination current). Specifically, high compliance current is supplied to a memory cell with a high resistance read from determination current to reduce the resistance distribution of programmed memory cells. On the other hand, low compliance current is supplied to a memory cell with low resistance read from determination current.

In this embodiment, resistive memory device 100 supplies high compliance current Ic1 to a memory cell A1 in which determination current is lowest (or read resistance is highest). On the other hand, resistive memory device 100 may supply low compliance current Ic3 to a memory cell A3 in which determination current is highest (or read resistance is lowest).

As high compliance current is supplied, there may be a large change in resistance of a memory cell. Thus, the program results in the largest change in resistance of memory cell A to which the high compliance current is applied. Meanwhile, program leads to the smallest change in resistance of memory cell A3 to which the low compliance current is applied. As a result, the resistance distribution of the programmed memory cells may be reduced.

Where a read voltage Vread is applied to the programmed memory cells, read currents Ir1, Ir2, and Ir3 are read from a memory cell. As compared to FIG. 7, FIG. 8 shows that the distribution of read currents Ir1, Ir2, and Ir3 is made much smaller. This means that the resistance distribution of memory cells is reduced by this embodiment.

According to the above-described configuration, the resistance distribution of programmed memory cells is reduced. Thus, desired resistance distribution may be achieved through a smaller number of program operations and a disturb stress caused by repeated application of a program voltage may be alleviated. As a result, reliability of a resistive memory device may be enhanced.

Figure 9:
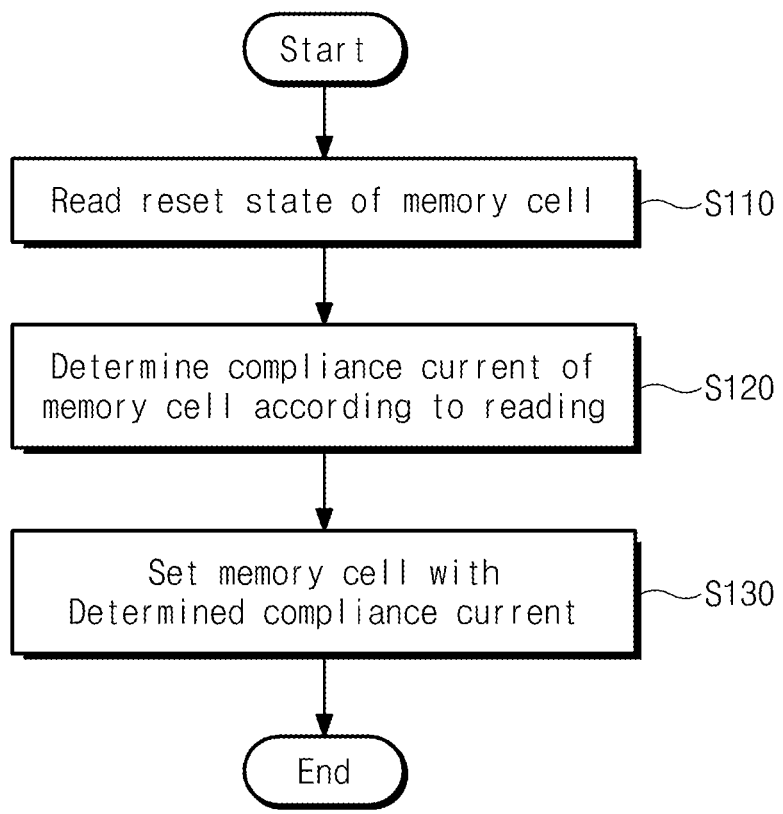
FIG. 9 is a flowchart illustrating a method of programming a resistive memory device according to an embodiment of the inventive concept.

FIG. 9 is a flowchart illustrating a method of programming a resistive memory device according to an embodiment of the inventive concept. The method comprises operations S110 to S130. For explanation purposes, it will be assumed that a resistive memory cell is programmed from a reset state to a set state.

In operation S110, resistive memory device 100 reads a resistance of a resistive memory cell in a reset state. More specifically, resistive memory device 100 applies a determination voltage Vd to a memory cell to detect determination current Id. A resistance of the memory cell is read from determination current Id.

In operation S120, resistive memory device 100 determines compliance current for programming a resistive memory cell with reference the read resistance. At this point, the higher the read resistance, the more compliance current of the resistive memory cell increases. In some embodiments, resistive memory device 100 may select one of a plurality of compliance currents as compliance current of the resistive memory cell according to the read resistance.

In operation S130, resistive memory device 100 programs the resistive memory cell to a set state according to the determined compliance current. More specifically, current limiter 143 supplies compliance current Ic to a memory cell according to the determined compliance current. Resistive memory device 100 applies a program voltage (or set voltage Vset) to program the memory cell. At this point, the greater the compliance current applied to the memory cell, the more a resistance of the memory cell changes.

Reading of the resistance of the memory cell and the determination of compliance current according to the read resistance are done in the same manner as described above. Compliance current supplied to a memory cell varies depending on a resistance of the memory cell before the memory cell is programmed. As a result, the distribution of the programmed memory cell may be reduced to enhance of a resistive memory device.

Figure 10:
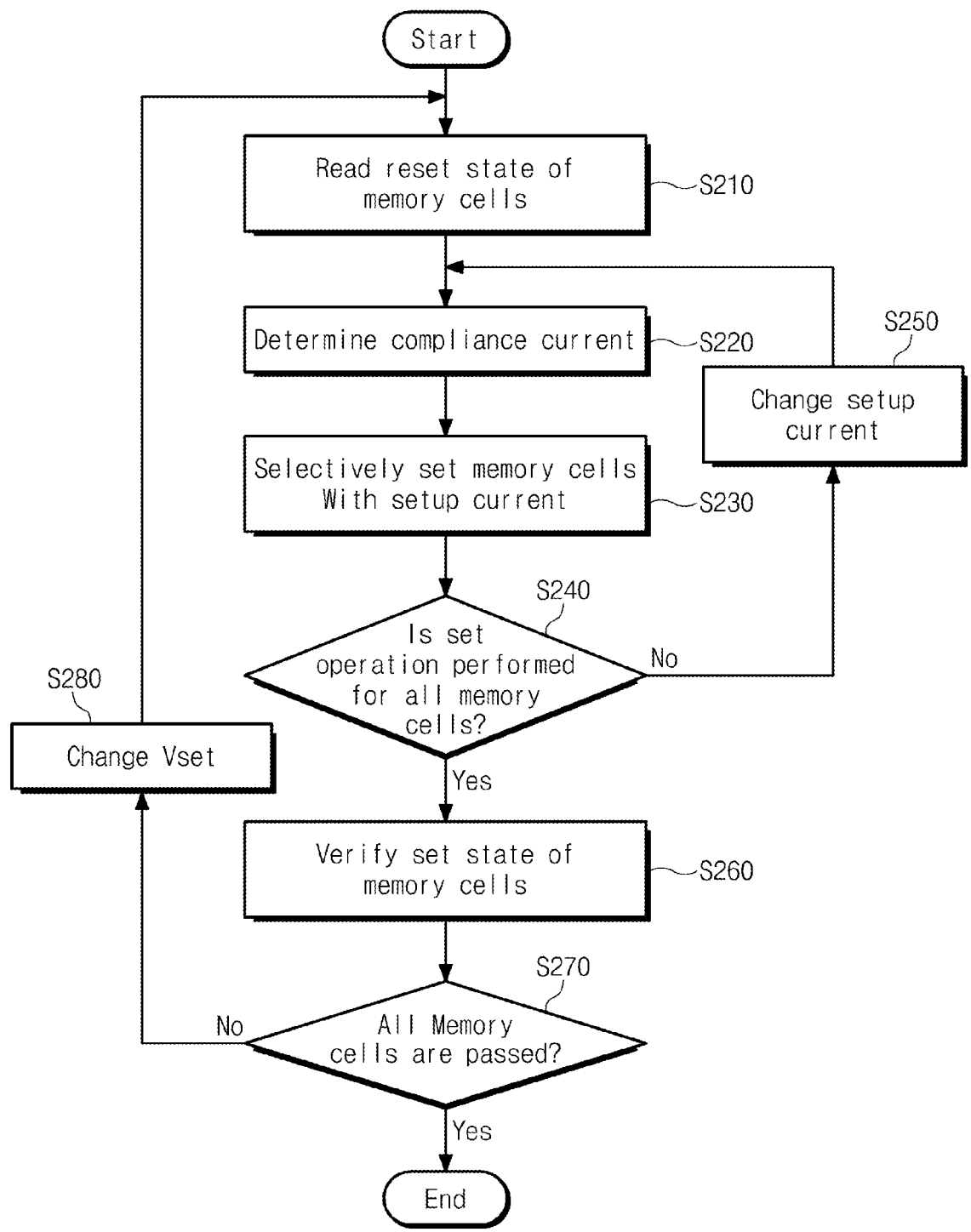
FIG. 10 is a flowchart illustrating a method of programming a resistive memory device according to another embodiment of the inventive concept.

FIG. 10 is a flowchart illustrating a method of programming a resistive memory device according to another embodiment of the inventive concept. The method comprises operations S210 to S280. For explanation purposes, it will be assumed that a resistive memory cell is programmed from a reset state to a set state.

In operation S210, resistive memory device 100 reads a resistance of a resistive memory cell in a reset state. More specifically, resistive memory device 100 applies a determination voltage Vd to a memory cell to detect determination current Id. A resistance of the memory cell is read from determination current Id.

In operation S220, resistive memory device 100 determines compliance current for programming a resistive memory cell with reference to the resistance read in operation S210. At this point, the higher the read resistance, the more the compliance resistance of the memory cell may increase. In some embodiments, resistive memory device 100 may select one of a plurality of compliance currents as compliance current of the memory cell according to the read resistance.

In operation S230, resistive memory device 100 compares setup current with the compliance current determined in operation S220. The setup current means compliance current set to a current program loop. If the setup current and the determined compliance current match each other, resistive memory device 100 applies a program voltage Vset to program a memory cell. In the meantime, if the setup current and the determined compliance current do not match each other, resistive memory device 100 does not program a memory cell.

That is, the setup current is compliance current supplied to a memory cell for programming the memory cell to a particular state. For example, a current program loop is for programming a memory cell to a first state, and a compliance current required to program the memory cell to the first state is Ic1. Under these circumstances, the setup current may be Ic1 and resistive memory device 100 programs the memory cell only if the determined compliance current matches the setup current (that is, Ic1).

In operation S240, resistive memory device 100 determines whether a program operation (or set operation) is performed for all of the memory cells. If the program operation is performed for all of the memory cells, the method proceeds to operation S260. If not, the method proceeds to operation S250.

In operation S250, resistive memory device 100 changes the setup current. At this point, the setup current sequentially changes to one of a plurality of compliance currents that the memory cell can have. And then, the method returns to operation S220.

In operation S260, resistive memory device 100 performs a verify operation for the memory cells. The verify operation is performed to verify whether the memory cells are programmed to a set state. At this point, resistive memory device 100 may apply a verify voltage to a memory cell to verify current flowing to the memory cell. In some embodiments, the verify voltage may be lower than program voltage Vset.

In operation S270, resistive memory device 100 determines whether all the memory cells are passed during the verify operation. If all the memory cells are passed, the method comes to an end. If not, the method proceeds to operation S280. In operation S280, resistive memory device 100 increases program voltage Vset. And then, the method returns to operation S210.

In the above method, compliance current supplied to a memory cell varies depending on a resistance of the memory cell before the memory cell is programmed. As a result, the distribution of the programmed memory cell may be reduced to enhance of a resistive memory device.

Figure 11:
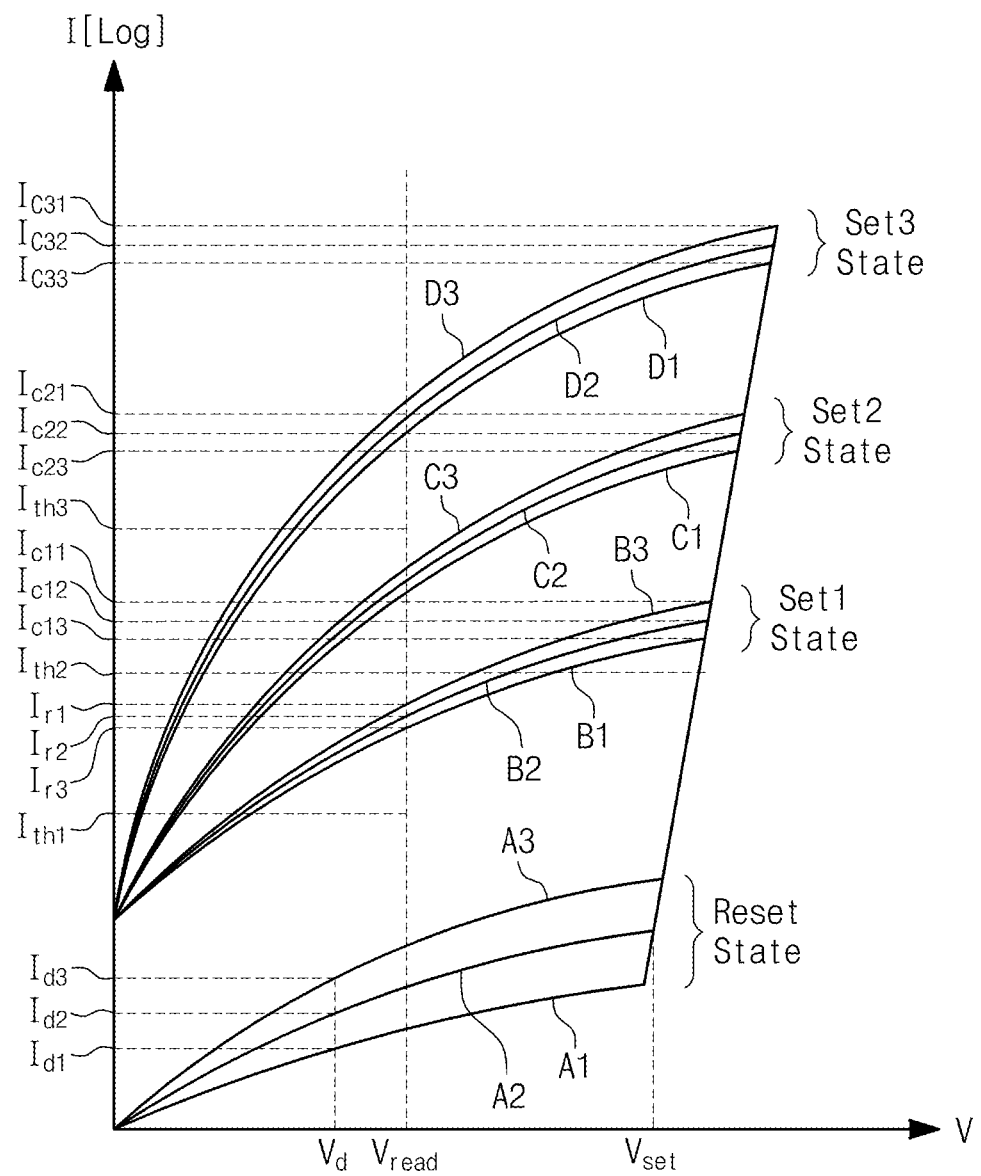
FIG. 11 illustrates an example of applying the inventive concept to a multi-level cell.

FIG. 11 illustrates an example of applying the inventive concept to a multi-level cell. A resistive memory cell may have three state Set1, Set2, and Set3. However, this is merely an example, and the resistive memory cell may have a different number of states, e.g., two states or four or more states.

In this embodiment, a resistance of a resistive memory cell is read before the resistive memory cell is programmed. Compliance current applied to each memory cell is adjusted according to the read resistance. In FIG. 11, reset-state curves for three resistive memory cells are shown.

The three memory cells may have different characteristics due to variations in manufacturing processes or environment. Thus, the three memory cells may have different current-voltage curves A1, A2, and A3 even in the same resistance state (e.g., reset state), respectively. In this embodiment, resets-state memory cells are programmed to a set state.

Before the memory cells are programmed, resistive memory device 100 applies a determination voltage Vd to each resistive memory cell. Determination currents Id1, Id2, and Id3 flowing to the respective memory cells are detected at the point of time where determination voltage Vd is applied. The application of determination voltage Vd and the detection of determination currents Id1, Id2, and Id3 are done in the same manner as described above.

The detected determination currents Id1, Id2, and Id3 indicate resistances of the memory cells. That is, the resistances of the memory cells may be read from determination currents Id1, Id2, and Id3. Under these circumstances, the less determination current, the higher resistance.

Compliance current to be supplied to each memory cell is determined with reference to the detected resistance (or determination current). Specifically, high compliance current is supplied to a memory cell with a high resistance read from determination current to reduce the resistance distribution of programmed memory cells. On the other hand, low compliance current is supplied to a memory cell with low resistance read from determination current.

In this embodiment, a memory cell may have three cell states Set1, Set2, and Set3. Thus, resistive memory device 100 supplies different compliance currents to the memory cell according to a target state. Under these circumstances, resistive memory device 100 supplies high resistive current in a target state having a low resistance.

In the example of FIG. 11, resistive memory device 100 selectively supplies one of compliance currents Ic11, Ic12, and Ic13 to each memory cell where the target state is a first set state Set1. Under these circumstances, high compliance current Ic11 is supplied to a memory cell A1 in which determination current is lowest (or a read resistance is highest). On the other hand, low compliance current Ic13 is supplied to a memory cell A3 in which determination current is highest (or a read resistance is lowest). Compliance current Ic12 is supplied to a memory cell A2. In FIG. 11, a resistance curve (or current-voltage curve) of memory cell A1 in the first set state Set1 is B3 due to a program voltage Vset. Similarly, resistance curves of memory cells A2 and A3 in the first set state Set1 are B2 and B1, respectively.

As high compliance current is supplied, there may be a large change in resistance of a memory cell. Thus, the program operation results in a largest change in resistance of memory cell A to which the high compliance current is applied. Meanwhile, the program operation leads to the smallest change in resistance to memory cell A3 to which the low compliance current is applied. As a result, the resistance distribution of the programmed memory cells may be reduced.

Where a read voltage Vread is applied to the memory cells programmed to the first set state Set1, read currents Ir1, Ir2, and Ir3 are read from a memory cell. As compared to FIG. 7, FIG. 11 shows that the distribution of read currents Ir1, Ir2, and Ir3 is made much smaller. This means that the resistance distribution of memory cells is reduced by this embodiment.

Where a target state is second set state Set2, resistive memory device 100 selectively supplies one of compliance currents Ic21, Ic22, and Ic23 to each memory cell. At this point, high compliance current Ic21 is supplied to a memory cell A1 in which determination current is lowest (or the read resistance is highest). On the other hand, resistive memory device 100 supplies low compliance current Ic23 to a memory cell A3 in which compliance current is highest (or the read resistance is lowest). Compliance current Ic22 is supplied to a memory cell A2.

In FIG. 11, a resistance curve (or current-voltage curve) of memory cell A1 in second set state Set2 is C3 due to a program voltage Vset. Similarly, resistance curves of memory cells A2 and A3 in second set state Set2 are C2 and C1, respectively.

Where a target state is the third set state Set3, resistive memory device 100 selectively supplies one of compliance currents Ic21, Ic22, and Ic23 to each memory cell. At this point, high compliance current Ic31 is supplied to a memory cell A1 in which determination current is lowest (or the read resistance is highest). On the other hand, resistive memory device 100 supplies low compliance current Ic33 to a memory cell A3 in which compliance current is highest (or the read resistance is lowest). Compliance current Ic32 is supplied to a memory cell A2.

In FIG. 11, a resistance curve (or current-voltage curve) of memory cell A1 in the third set state Set3 is D3 due to a program voltage Vset. Similarly, resistance curves of memory cells A2 and A3 in the third set state Set3 are D2 and D1, respectively.

Similar to first state Set1, as high compliance current is supplied, there may be a large change in resistance of a memory cell. As a result, according to the program method of a memory cell, the resistance distribution of the programmed memory cells may be reduced.

In some embodiments, a programmed state of a memory cell may be read using a plurality of threshold voltages. As shown in FIG. 11, a plurality of programmed states Set1, Set2, and Set3 may have corresponding threshold current values Ith1, Ith2, and Ith3, respectively.

During a read operation, a wordline WL of a selected memory cell is applied with a read voltage Vread and a bitline BL of the selected memory cell detects sensing current flowing to a memory cell. Where a value of the detected sensing current is smaller than that of first threshold current Ith1, the selected memory cell is determined to be in a first set state (Set1 State). Where the value of the detected sensing current is greater than that of the first threshold current Ith1 and smaller than that of second threshold voltage Ith2, the selected memory cell is determined to be in a second set state (Set2 State). Similarly, where a value of the detected sensing current is greater than the third threshold current Ith3, the selected memory cell is determined to be in a third set state (Set3 State).

In this embodiment, a memory cell may be programmed to a plurality of target states Set1, Set2, and Set3 by changing compliance current. In addition, target states Set1, Set2, and Set3 may be read using threshold current. Moreover, the distribution of a programmed memory cell may be reduced. Thus, capacity of a resistive memory device may increase and reliability of the resistive memory device may be enhanced.

The above described resistive memory devices can be applied to a memory cell array with a three-dimensional structure. FIGS. 12 to 15 are block diagrams illustrating examples of a resistive memory device comprising a memory cell with a three-dimensional structure according to embodiments of the inventive concept.

Figure 12:
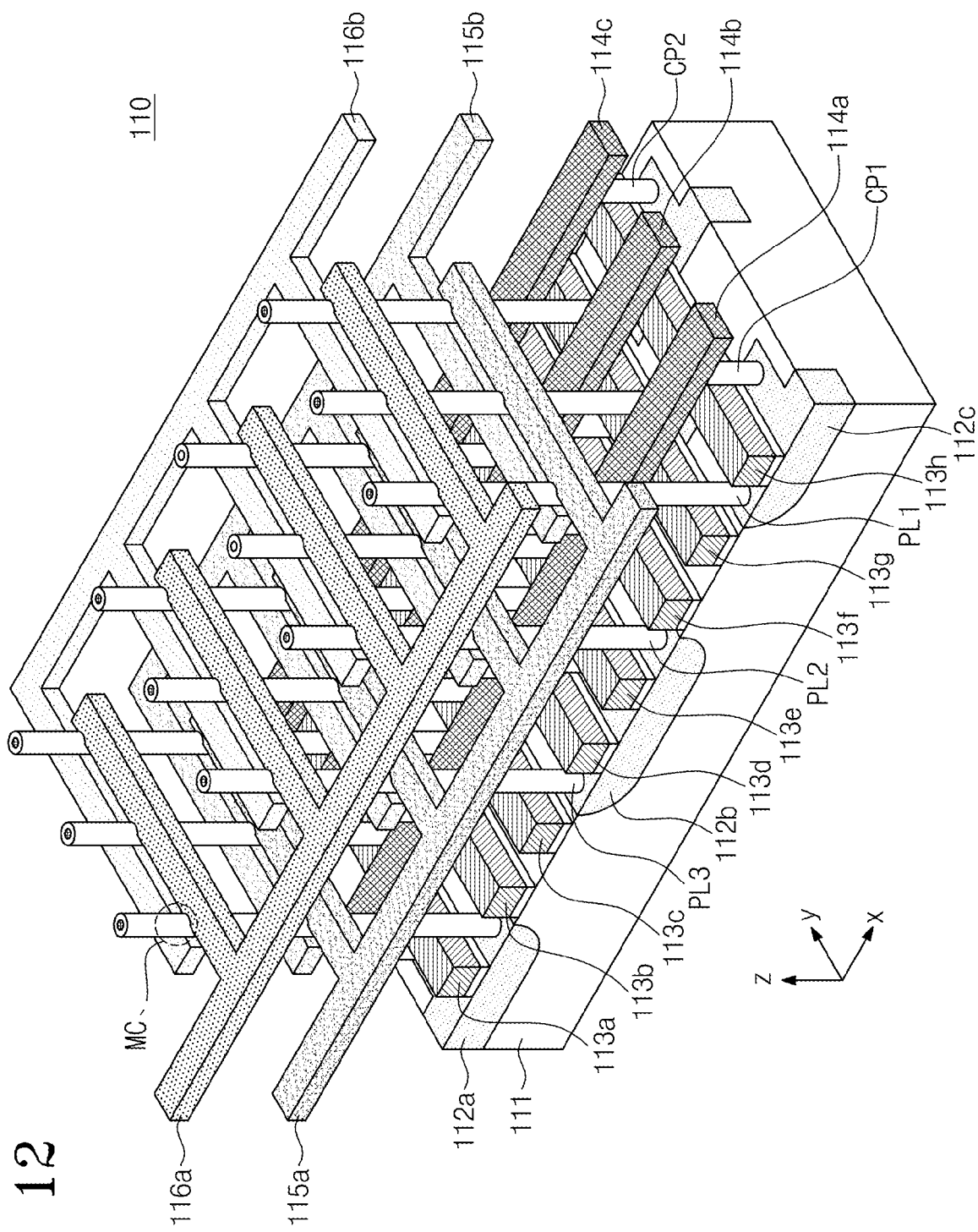
FIGS. 12 to 15 are block diagrams illustrating an example of a resistive memory device comprising a memory cell with a three-dimensional structure according to an embodiment of the inventive concept.

FIG. 12 is a perspective view illustrating a three-dimensional structure of memory cell array 110 according to an embodiment of the inventive concept.

Referring to FIG. 12, memory cell array 110 comprises structures extending in a plurality of directions x, y, and z. To form memory cell array 110, a substrate 111 is provided. Substrate 111 may comprise, for instance, a P-well formed by introducing a V group element such as boron (B). Alternatively, substrate 111 may comprise a P-well provided within an N-well. Hereinafter, it will be assumed that substrate 111 is a P-well. However, substrate 111 is not limited to the P-well.

Doping regions 112a-112c are formed on substrate 111. For example, doping regions 112a-112c may be made of an n-type conductor which is different from the conductivity type of substrate 111. However, the conductivity type of doping regions 112a-112c is not limited to the n-type. Doping regions 112a-112c are sequentially formed in the x-direction. This structure is repeated in the y-direction. Wordlines 113a-113h connected to metal lines formed at a plurality of layers are formed over doping regions 112a-112c to be electrically isolated from doping regions 112a-112c.

Doping regions 112a-112c are connected to each other by contact plugs CP1 and CP2 and bitlines 114a-114c extending in the x-direction. Doping regions 112a-112c are connected to vertical electrodes of pillars PL1-PL4 and bitlines 114a-114c, respectively. Thus, a bitline and the vertical electrodes of pillars PL1-PL4 may be electrically connected by doping regions 112a-112c. Pillars PL1-PL4 are connected to metal line layers 115a, 115b, 116a, and 116b stacked in multiple layers, respectively. A metal line 115 and a metal line 115b connected to respective pillars in the form of comb at a plurality of metal layers may be each connected to a global word line.

In the example of FIG. 12, memory cell array 110 is formed with a three-dimensional structure. The three-dimensional structure shown in FIG. 12 is merely an example, and resistive memory cells may be stacked in various manners.

Figure 13:
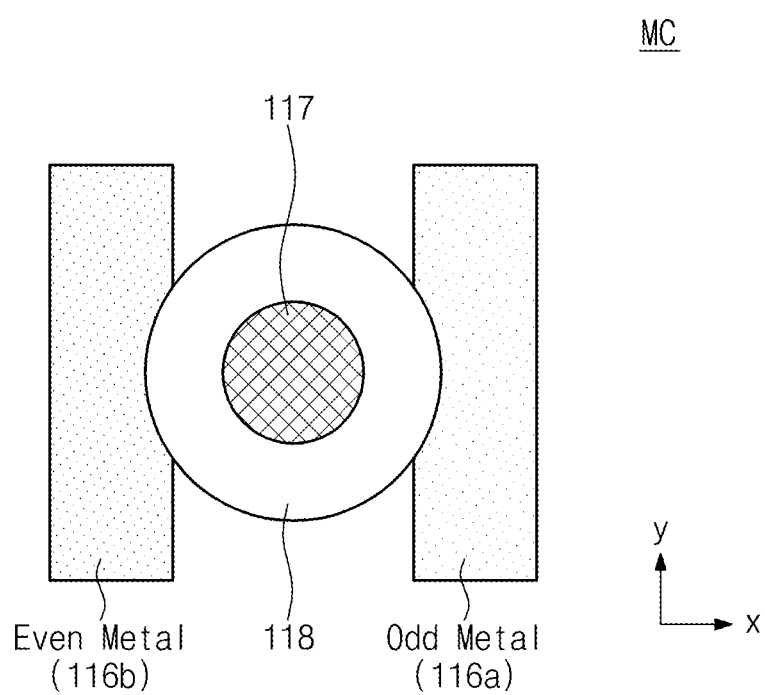

FIG. 13 is a cross-sectional view of a resistive memory cell MC formed in a single layer.

Referring to FIG. 13, memory cell MC comprises pillars 117 and 118 between a first metal line 116a and a second metal line 116b. A pillar is disposed between metal lines 116a and 116b constituting a horizontal electrode to penetrate a substrate in a vertical direction (z-direction). The pillar comprises a cylindrical data storage layer 118 and a vertical electrode 117. A single resistive memory cell is constituted by vertical electrode 117 connected to a bitline and metal lines 116a and 116b connected to a wordline. Data storage layer 118 can be formed by means of etching and deposition processes in a vertical direction. Vertical electrode 117 may be formed by means of a deposition process such as, for example, physical vapor deposition (PVD), chemical vapor deposition (CVD) or atomic vapor deposition (AVD).

Figure 14:
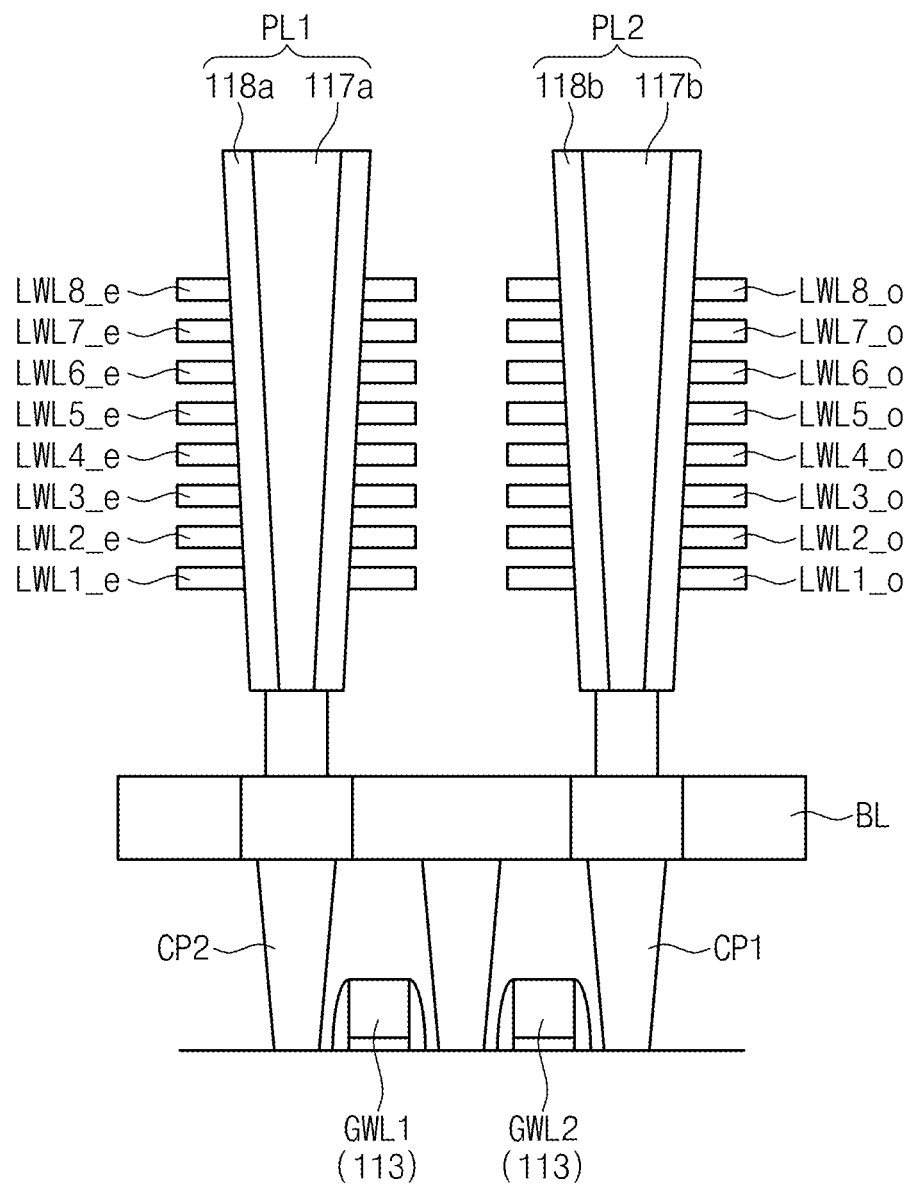

FIG. 14 shows a cross section of FIG. 12 according to an embodiment of the inventive concept.

Referring to FIG. 14, memory cell array 110 comprises a plurality of horizontal electrodes LWL1_e~LWL8_e and LWL1_o~LWL8_o vertically stacked on pillars PL1 and PL2 constituting a vertical electrode and a resistive memory cell and a substrate, bitlines connected to pillars through a doping region, and global wordlines GWL1 and GWL2 for supplying a wordline voltage to a plurality of horizontal electrodes.

Figure 15:
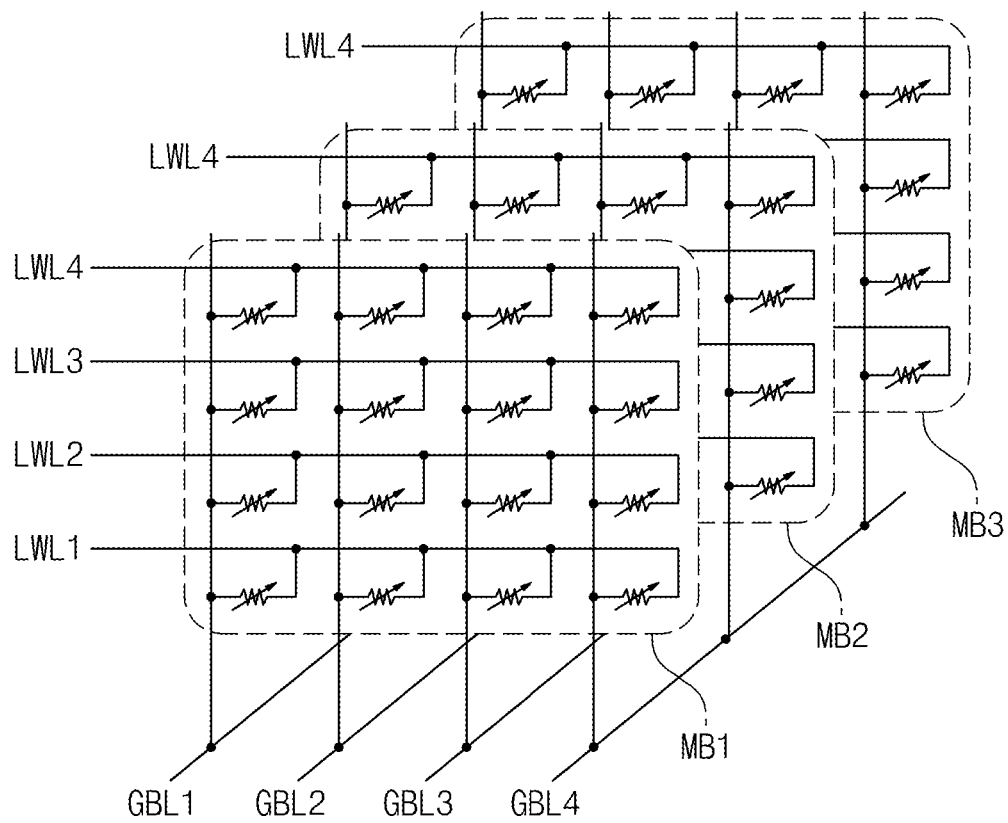

FIG. 15 is a circuit diagram of memory cell array 110 of FIG. 12 according to an embodiment of the inventive concept.

Referring to FIG. 15, memory cell array 110 comprises a plurality of memory blocks MB1-MB3 constituting a single unit on an xy plane. Memory cell array 110 comprises a plurality of local bitlines LBL extending side by side in a z-direction and a plurality of local wordlines LWL1-LWL4 extending side by side in a y-direction perpendicular to a z-direction. Although not shown, memory blocks MB1-BM3 may be connected to different local wordlines LWL, respectively.

Local bitlines LBL11-LBL43 formed by a vertical channel of a pillar are connected to global bitlines GBL1-GBL4, respectively. Resistive memory cells of cell array 110 are connected to local wordlines LWL1-LWL4 or local bitlines LBL11-LBL43. The resistive memory cells may be programmed or sensed by a voltage applied to local wordlines LWL1-LWL4 or local bitlines LBL11-LBL43.

Figure 16:
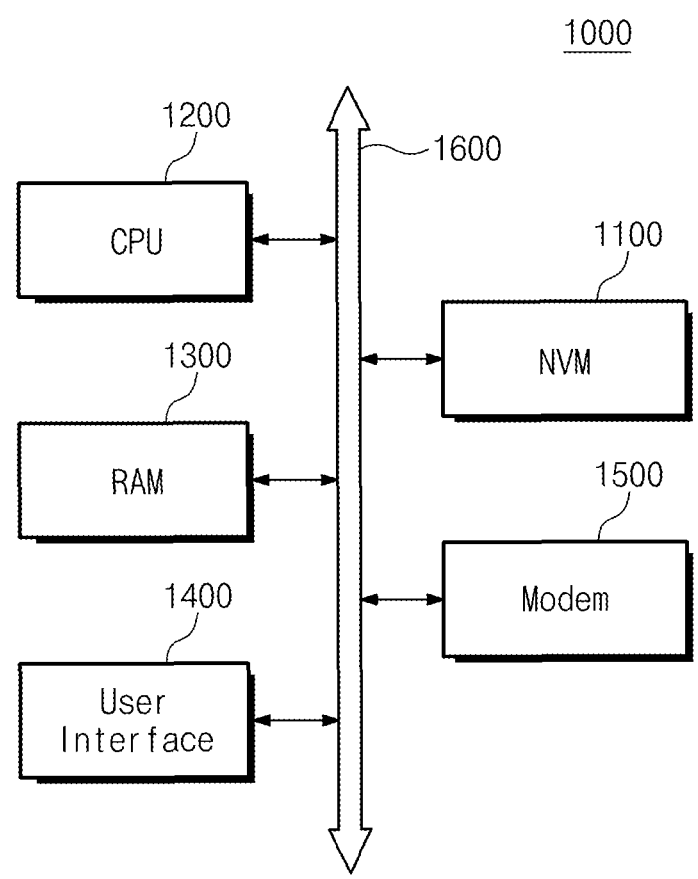
FIG. 16 is a block diagram of a computing system comprising a memory device according to an embodiment of the inventive concept.

FIG. 16 is a block diagram of a computing system 1000 comprising a memory device according to an embodiment of the inventive concept.

Referring to FIG. 16, computing system 1000 comprises a nonvolatile memory device (NVM) 1100, a central processing unit (CPU) 1200, a random access memory (RAM) 1300, a user interface 1400, and a modem 1500 such as a baseband chipset. These features are electrically connected to a system bus 1600.

Nonvolatile memory device 1100 can be implemented similar to resistive memory device 100 as described above. Accordingly, it may adjust compliance current depending on a read resistance of a memory cell during a program operation. Thus, the resistance distribution of a programmed memory cell may be reduced.

Where computing system 1000 is a mobile apparatus, a battery may be additionally provided to supply an operating voltage. Although not shown, computing system 1000 may further comprise other features such as, e.g., an application chipset, a camera image processor (CIS), a mobile dynamic random access memory (DRAM), and the like.

The above-described resistive memory devices can be packaged using various packages or package types. For example, they may be packaged using one of Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

As indicated by the foregoing, certain embodiments of the inventive concept can reduce disturb stress applied to a memory cell through the use of a program voltage. Moreover, certain embodiments can also reduce a resistance distribution of memory cells and improve the reliability of a resistive memory device.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A resistive memory device, comprising:
   a resistive memory cell; and
   a read/program circuit configured to program the resistive memory cell from a first state to a second state, wherein the read/program circuit reads a resistance in the first state of the resistive memory cell and adjusts a compliance current supplied to the resistive memory cell in the first state according to the read resistance during the program operation,
   wherein the read/program circuit comprises
   a program voltage generator configured to supply a program voltage to the resistive memory cell, and
   a current limiter connected to a bitline of the resistive memory cell and configured to supply the compliance current to the resistive memory cell,
   wherein the compliance current of the resistive memory cell increases proportional to the read resistance, and limits maximum current flowing to the resistive memory cell.

2. The resistive memory device of claim 1, wherein the current limiter comprises a current mirror configured to selectively supply one of currents with a plurality of levels to the bitline of the resistive memory cell during the program operation.

3. The resistive memory device of claim 1, wherein the read/program circuit supplies a determination voltage for reading the resistance in the first state to the resistive memory cell.

4. The resistive memory device of claim 1, wherein the resistive memory cell has a lower resistance in the second state than in the first state.

5. The resistive memory device of claim 1, wherein the resistive memory cell is a multi-level cell (MLC).

6. The resistive memory device of claim 1, wherein the resistive memory cell is in a three-dimensional cell array stacked in a vertical direction.

7. A method of programming a resistive memory device, comprising:
   detecting a resistance of a resistive memory cell in a first state;
   determining a compliance current of the resistive memory cell based on the detected resistance; and
   maintaining the resistive memory cell in the first state or programming the resistive memory cell to a second state according to the determined compliance current,
   wherein the compliance current of the resistive memory cell increases proportional to the read resistance, and limits maximum current flowing to the resistive memory cell.

8. The method of claim 7, wherein determining the compliance current comprises selecting among a plurality of compliance currents.

9. The method of claim 7, wherein the programming of the resistive memory cell comprises comparing the determined compliance current with setup current, and selectively programming the resistive memory cell according to a result of the comparison.

10. The method of claim 9, wherein the programming of the resistive memory cell further comprises changing the setup current.

11. The method of claim 7, further comprising verifying whether a resistance state of the resistive memory cell transitions to the second state.

12. The method of claim 11, further comprising increasing a program voltage according to a result of the verification.

13. The method of claim 7, wherein the first state is a reset state and the second state is a set state.

14. A method of programming a resistive memory device, comprising:
   detecting a resistance of a plurality of resistive memory cells in a first state;
   determining a compliance current for programming the resistive memory cells based on the detected resistance;
   selectively programming the resistive memory cells based on the determined compliance current; and
   comparing a setup current with the compliance current, and as a consequence of determining that the setup current matches the compliance current, applying a program voltage to program the resistive memory cells, wherein the compliance current of the resistive memory cells increase proportional to the read resistance, and limits maximum current flowing to the resistive memory cells.

15. The method of claim 14, further comprising:
determining whether a program operation has been performed for all of the resistive memory cells, and
upon determining that the program operation has been performed for all of the resistive memory cells, performing a verification operation on the resistive memory cells, and
upon determining that the program operation has not been performed for all of the resistive memory cells, changing the setup current and selectively programming the resistive memory cells with the setup current based on the compliance current.

16. The method of claim 14, wherein the first state is a reset state and the second state is a set state.

* * * * *